United States Patent [19]
Lin

[11] Patent Number: 6,007,966
[45] Date of Patent: Dec. 28, 1999

[54] NEGATIVE-TYPE PHOTOSENSITIVE COMPOSITION

[75] Inventor: Hsien-Kuang Lin, Taipei, Taiwan

[73] Assignee: Industrial Technology Research Institute, Hsinchu, Taiwan

[21] Appl. No.: 09/150,159

[22] Filed: Sep. 9, 1998

[51] Int. Cl.$^6$ .............................. G03C 1/725; C08J 3/28
[52] U.S. Cl. ................................. 430/281.1; 430/287.1; 522/149
[58] Field of Search ................... 522/121, 149; 430/287.1, 285.1, 281.1

[56] References Cited

U.S. PATENT DOCUMENTS

| | | | |
|---|---|---|---|
| 4,722,947 | 2/1988 | Thanawalla et al. | 522/120 |
| 5,087,552 | 2/1992 | Horigome et al. | 430/280 |
| 5,114,830 | 5/1992 | Surber | 430/280 |
| 5,296,334 | 3/1994 | Castaldi | 430/280 |
| 5,936,005 | 8/1999 | Askienazy et al. | 522/120 |

*Primary Examiner*—Janet Baxter
*Assistant Examiner*—Rosemary Ashton
*Attorney, Agent, or Firm*—W. Wayne Liauh

[57] ABSTRACT

A photosensitive composition is disclosed particularly for making printed circuit boards. It contains: (a) a polymer binder; (b) a photoinitiator; and (c) an unsaturated photomonomer. The polymer binder is prepared from a reaction among the following reactants: (i) a styrene-maleic anhydride resin containing repeating units of styrene and anhydride groups, (ii) an unsaturated compound containing at least one hydroxy group and at least three acrylic groups, and (iii) a saturated alcohol. The styrene-maleic anhydride resin is prepared from a polymerization reaction of styrene and maleic anhydride in a molar ratio ranging from 3:1 to 1:1, and preferably has a molecular weight between 800 and 100,000.

20 Claims, No Drawings

NEGATIVE-TYPE PHOTOSENSITIVE COMPOSITION

FIELD OF THE INVENTION

The present invention relates to a novel negative-type photosensitive composition for use in making negative-type etching photoresist or soldering. More specifically, the present invention relates to a novel alkaline-developable negative-type photosensitive composition with improved photosensitivity, chemical resistance and hardness, so that it can be most advantageously used in making photoresists for use in the preparation of printed circuit boards (PCBs). One of the most important advantages of the photosensitive composition of the present invention is that it does not contain molecules that can cause health or environmental concerns. This is a distinctive advantage of the present invention over conventional photosensitive compositions, which, in order to provide the required photosensitivity and/or degree of crosslinking, typically contain low molecular weight chemicals that are often toxic or carcinogenic. The photosensitive composition of the present invention ensures that the printed circuits boards prepared using the same will not cause health concerns even after prolonged use and constant exposure.

BACKGROUND OF THE INVENTION

Photosensitive composition plays an important role in the fabrication of printed circuit boards (PCBs). Photosensitive compositions can be classified, based on their intended applications, into two main categories: photoresists for etching and solder resists. The former are used in the laying out of the copper circuit pattern using photolithographic techniques and will be removed after the copper circuit pattern is completed. The latter are used after the copper circuit pattern is laid out to protect certain portions of the copper circuit from being contacted by the soldering material during the soldering process. Both types of photosensitive compositions can be applied using either a liquid-type or a film-type technique. With the liquid-type technique, the photosensitive composition is applied onto the substrate using screen printing, roller coating, curtain coating, dip coating, etc. With the film-type technique, on the other hand, the photosensitive composition is first coated onto a transparent film, typically a transparent polyester film, which is then overlaid on the substrate and the photosensitive composition is then applied onto the substrate surface by hot-laminating or other suitable techniques.

Photosensitive materials, or photoresists in general, can also be categorized according to how they are developed. At the present time, there are two most common types of developments for photoresists: the solvent-development type and the alkaline-development type. The former uses a solvent, typically an organic solvent, to remove (for a negative type photoresist) the exposed portion of the photoresist. On comparison, if the photosensitive composition contains carboxyl groups, the exposed portions can be removed, and thus developed, using an alkaline solution such as sodium carbonate. Because the solvent-type development process can cause solvent exhaust and waste disposal problems which can cause significant increase in the overall manufacturing cost, the current industrial trend is to use the alkaline-development type processes. During the alkaline-development process, the carboxyl-containing polymer molecules will be neutralized by sodium carbonate to form a polymer salt. The unexposed portion of the photosensitive composition, which was not cross-linked, will be emulsified and caused to be dispersed in water. This thus completes the development process utilizing a negative-type photoresist.

The photosensitivity of a photosensitive composition is related to the degree of crosslinking after being exposed to UV light. Typically, a greater number of unsaturated double bonds (typically provided by the so-called photomonomers) in the photosensitive composition will result in a higher degree of cross-linking. However, excessive amounts of photomonomers would result in the photosensitive layer being too tacky, thus adversely affecting the image transfer process. With a dry film type photosensitive material, the photosensitive composition is protected by the transparent polyester film from being contaminated and the oxygen-induced polymerization-inhibition, and the requirement for the unsaturated double bonds can be entirely supplied by the photomonomers. Under these conditions, a alkaline-developable photoresist can be prepared by introducing only the carboxyl groups into the polymer binder, there is no need to add double bonds into the polymer binder.

On the other hand, when a solution-type photosensitive material is used, because no such protective polyester film is provided, the film thickness and the reactivity of the photosensitive film becomes important, and, as a result, the photosensitive composition can only contain a limited amount of photomonomers. In order to compensate for the decreased photosensitivity due to the reduction in the amount of photomonomers, unsaturated double bonds must be incorporated into the polymer binder so as to increase its post- UV exposure degree of cross-linking. This method has been disclosed in, for example, U.S. Pat. No. 5,055,378, which disclosed a photosensitive composition containing a polymer binder formed from the reaction of an epoxy resin with an carboxyl-containing unsaturated compound so as to impart unsaturated double bonds to the polymer binder. However, the polymer binder disclosed in the '378 patent does not contain carboxyl groups. As a result, it must be developed using a solvent and cannot be developed using an alkaline solution.

U.S. Pat. Nos. 5,100,767, 5,009,982 and 4,943,516, and Japan Patents 61-243869 and 1-54390 disclosed various photosensitive compositions whose polymer binders are imparted with carboxyl groups by reacting the polymer binder disclosed in the '378 patent with anhydrides. Such an additional step not only allowed the photosensitive composition to become alkaline-developable, it also improved the photosensitivity of the polymer binder by introducing unsaturated double bonds into the polymer binder. However, because the formation of such alkaline-developable photosensitive polymer binder requires excess (about 10 to 20%) amounts of unsaturated carboxyl group containing compounds (such as acrylic acid or methylacrylic acid), which are typically volatile and can cause health concerns, the final finished products can cause health hazards to human bodies, especially after long term exposure to these products. This is one of the main disadvantages of the photosensitive compositions disclosed in the above-mentioned patents.

U.S. Pat. Nos. 4,764,452 and 5,364,736 and Japanese patents 4-239070 and 2-47657 disclose photosensitive compositions containing polymer binders based on modified styrene-maleic anhydride resins, or the SMA resins. In these photosensitive compositions, partially-esterized SMA resins were reacted with saturated low-molecular weight alcohols in a ring-opening reaction by which carboxyl groups are introduced into the side chains of the SMA resins to form a carboxyl group containing polymer binder which consequently becomes base-developable. Because the reaction to prepare the base-developable polymer binder does not involve unsaturated carboxyl group containing molecules, it does not raise the health hazard problem mentioned above. However, these photosensitive compositions exhibited another type of shortcoming in that, because the polymer binder does not contain unsaturated double bonds, the developed, or hardened, final product does not provide adequate chemical resistance and hardness due to inadequate degree of crosslinking. In order to increase the degree of crosslinking for the post-exposure polymer binder, it has been proposed to add a mono-functional unsaturated alcohol, such as hydroxyethyl (meth)acrylate, in the ring-open reaction of the SMA resin. This method was disclosed in U.S. Pat. Nos. 5,087,552, 5,114,830 and 5,296,334. The use of mono-functional unsaturated alcohols not only imparts the carboxyl group into the SMA resin, it also imparts double bonds so as to increase the degree of cross-linking. However, while this action increases the photosensitivity of the polymer binder, it also returns the old problem of leaving low-molecular weight volatile, smelly and potentially health-hazard molecules in the polymer binder.

SUMMARY OF THE INVENTION

The primary object of the present invention is to develop an improved negative-type photosensitive composition which provides desirable photosensitivity, chemical resistance and hardness without raising environmental or health concerns. More specifically, the primary object of the present invention is to develop an improved negative-type alkaline-developable photosensitive composition with improved degree of cross-linking after exposure to light so as to provide improved photosensitivity, and improved chemical resistance and hardness. The photosensitive composition disclosed in the present invention contains a photosensitive polymer binder which is synthesized without the use of those low-molecular compounds that can cause environmental and health concerns. Therefore, the photosensitive composition of the present invention can be advantageously and safely used in making photoresists for making printed circuit boards that have become an inseparable item in our everyday life.

The photosensitive composition disclosed in the present invention, which can be most advantageously used in preparing alkaline-developable negative-type photoresists for fabricating printed circuit boards, comprises:

(a) a polymer binder synthesized from the following reactants:
  (i) a styrene-maleic anhydride resin,
  (ii) an unsaturated compound containing at least one hydroxy group and at least three acrylic groups, and
  (iii) a saturated alcohol;
(b) a photoinitiator; and
(c) an unsaturated photomonomer.

The styrene-maleic anhydride resin is obtained from the co-polymerization of styrene and maleic anhydride, and it contains anhydride groups so as to allow a ring-opening (or esterification) reaction with alcohols and cause carboxyl groups to be imparted into side chains of the styrene-maleic anhydride resin.

The relative amount of anhydride groups in the styrene-maleic anhydride resin can be controlled by adjusting the ratio between styrene and maleic anhydride monomers. Preferably, the ratio between the respective repeating units of styrene and maleic anhydride in the styrene-maleic anhydride resin should be between 1:1 and 3:1. A higher ratio of styrene units would result in better hardness of the final polymer resin, however, at the expense of decreased availability of the number of substituting sites. At the ratio of 1 to 1, the number of unsaturated double bonds, as well as the number of carboxyl groups, that can be imparted to the polymer resin is the maximum, resulting in a maximum degree of crosslinking and photosensitivity. However, the photosensitivity and adhesion do not necessary correspond directly to the number of carboxyl groups. Other factors such as the amount and types of additives that are present in the photosensitive composition may also affect the optimal extent of carboxyl groups in the polymer resin.

Preferably, the molecular weight of the styrene-maleic anhydride resin should be between 800 and 100,000. If the molecular weight is below 800, the resultant resin will exhibit poor filmability. On the other hand, if the molecular weight is greater than 100,000, the development process after exposure may not leave a completely clean pattern.

The unsaturated alcohol contains at least three acrylic groups so that, after reacting with the anhydride groups, it can introduce unsaturated vinyl groups in the side chains of the styrene-maleic anhydride resin, so as to improve the photosensitivity and degree of crosslinking of the polymer resin. The unsaturated alcohol specified in the present invention also exhibits low volatility. Examples of the unsaturated alcohols suitable for the present invention include pentaerythritol tri-acrylate (PETA), dipentaerythritol pentacrylate (DPPA), etc. PETA has a relatively lower molecular weight, and, after grafting, it results in a shorter side chain thus a better hardness of the resultant polymer film. Thus, PETA will be a better choice for applications such as those involving the use of solder resist which require high hardness. Preferably, the equivalent ratio between the anhydride groups in the styrene-maleic anhydride resin and the unsaturated alcohol should between 1:0.05 and 1:0.9, or more preferably, between 1:0.2 and 1:0.7. If the amount of unsaturated alcohols is too high, the resultant film may not provide adequate hardness. On the other hand, if the amount of unsaturated alcohols is too low, the resultant film may not contain enough double bonds, resulting in inadequate photosensitivity.

The purpose of adding saturated alcohols in the present invention is to facilitate ring-opening reaction, so as to cause enough number of carboxyl groups to be formed into the polymer side chains. A wide range of saturated alcohols can be used in the present invention. One important requirement it that it should not cause any potential health hazard. Examples of saturated alcohols suitable for the present invention include various alkyl alcohols such as ethanol, n-propanol, isopropanol, n-butanol, 2-butanol, iso-butanol, n-pentanol, 2-methyl-1-pentanol, iso-heptanol, n-hexanol, n-heptanol, cyclopentanol, cyclochexanol, etc; ether alcohols such as methoxyethanol, ethoxyethanol, butoxyethanol, cartitol, propyleneglycol monomethyl ether, dipropyleneglycol, etc. The amount and molecular weight of the saturated alcohols can impact the amount of carboxyl groups to be formed into the polymer binder, as well as the film hardness thereof. Generally speaking, the higher the amount of saturated alcohols used in the reaction, the higher the number of the anhydride rings to be opened, and thus, a higher photosensitivity. The ratio between anhydride groups and saturated alcohols should preferably range between 1:0.2 and 1:10. The molecular weight of the saturated alcohol impacts the chain-to-chain distance in the polymer binder, and a smaller saturated alcohol molecule typically results in a higher hardness of the polymer binder. However, too high a hardness before light exposure may adversely affect the photosensitivity of the photoresist. In general, the amount and molecular weight of the saturated alcohols should be determined based on the valency of the acid groups in the polymer resin and the desired hardness, as well as the presence of other additives.

Similar to the situation for saturated alcohols, a wide range of photoinitiators can be used in the present invention. Preferred photoinitiators should be those which exhibit high degree of optical resolution and can be relatively unaffected by the presence of oxygen, which can retard the crosslinking reaction and reduce the degree of crosslinking at the polymer resin surface. Examples of suitable photoinitiators include benzil dimethyl ketal, 2,4-diethylthioxanthone, isopropylthioxanthone, 2-methyl-1-(4-methythio)pehyl)-2-monpholinopropanone-1 )one, ethyl(p-dimethylamino) benzoate, Michler's ketone, etc.

The presence of unsaturated photomonomer in the photosensitive composition provides the required double bonds to proceed with the polymerization reaction upon exposure to UV light. The higher the number of double bonds is present per molecule, the high the degree of crosslinking. Suitable photomonomers include trimethylolpropane triacrylate, pentaerythritol triacrylate, pentaerythritol tetraacrylate, dipentaerythritol pentaacrylate, dipentaerythritol hexaacrylate, bis-phenol A-type epoxy acrylate, urethane acrylate, etc. The photomonomers can be alone or in combination thereof. Section of the optimal photomonomers and the amount used are dependent on the desired hardness of the photoresist.

If the photosensitive composition is to be used in conjunction with liquid-type solder resist applications, other additives must be included. For example, the photosensitive composition intended for such applications must also contain an thermally curable resin, such as an epoxy resin. Suitable epoxy resins include bisphenol A-type epoxy resin, phenol formaldehyde-type epoxy resin, phenol-aldehyde-type epoxy resin, brominated bisphenol A-type epoxy resin, etc. A curing agent can also be added to improve the thermally curable characteristics of the epoxy resin. For use in the present invention, the suitable curing agent must not cause the epoxy resin to become hardened at temperatures below 80° C. However, at elevated temperatures, the curing agent should cause the epoxy resin to be rapidly hardened. Suitable curing agents include various imidazoles, dicyandiamid, etc.

Other additives can also be added in the photosensitive composition of the present invention. These include fillers, solvent, dispersion agent, anti-sagging agent, defoamer, leveling agent, dyes or pigments, thermal inhibitor, flame retardation agent, etc.

After all the ingredients such as the polymer binder, fillers, hardening agent, pigments, etc., are mixed together, the mixture is milled to ensure a homogeneous dispersion of all the ingredients. Homogeneous dispersion is important to attain the smoothness of the photoresist film and a shining surface.

DETAILED DESCRIPTION OF THE PREFERRED EMBODIMENT

The present invention discloses an improved negative-type base-developable photosensitive composition which provides desirable photosensitivity, chemical resistance and hardness without raising environmental or health concerns. The photosensitive composition disclosed in the present invention contains a photosensitive polymer binder which is synthesized without the use of those low-molecular compounds that can cause environmental and health concerns. This is a common experienced with many commercially available photosensitive compositions. The photosensitive composition of the present invention can be advantageously and safely used in making photoresists for making printed circuit boards that have become an inseparable item in our everyday life.

The photosensitive composition disclosed in the present invention comprises:
(a) a polymer binder synthesized from the following reactants:
  (i) a styrene-maleic anhydride resin,
  (ii) an unsaturated compound containing at least one hydroxy group and at least three acrylic groups, and
  (iii) a saturated alcohol;
(b) a photoinitiator; and
(c) an unsaturated photomonomer.

Each of these components is discussed in more detail below.

In the present invention, the styrene-maleic anhydride resin is obtained from the co-polymerization reaction of styrene and maleic anhydride monomers; it contains anhydride groups which allow a ring-opening (or esterification) reaction with alcohols thus causing carboxyl groups to be imparted into side chains of the styrene-maleic anhydride resin.

The relative amount of anhydride groups in the styrene-maleic anhydride resin is controlled by adjusting the ratio between styrene and maleic anhydride monomers. The ratio between the respective repeating units of styrene and maleic anhydride in the styrene-maleic anhydride resin should preferably be between 1:1 and 3:1. A higher ratio of styrene units in the polymer resin would result in better hardness, however, it is done at the expense of decreased number of available substitution sites. At the ratio of 1 to 1, the number of unsaturated double bonds, as well as the number of carboxyl groups, that can be imparted to the polymer resin reached the relative maximum value, resulting in a maximum degree of crosslinking and photosensitivity. However, as discussed earlier, the photosensitivity and adhesion do not necessary correspond directly to the number of carboxyl groups. Other factors such as the amount and types of additives that are present in the photosensitive composition may also affect the optimal extent of carboxyl groups in the polymer resin. The molecular weight of the styrene-maleic anhydride resin should preferably be between 800 and 100,000. If the molecular weight is below 800, the resultant resin will exhibit poor filmability. On the other hand, if the molecular weight is greater than 100,000, the removal process after development may not be complete. Examples of commercially available styrene-maleic anhydride resins include SMA 1000, SMA 2000 and SMA 3000 made by ATO Co. These styrene-maleic anhydride resins have ratios of repeating units of styrene to maleic anhydride of 1:1, 2:1, and 3:1, respectively.

The unsaturated alcohol contains at least three acrylic groups so that, after reacting with the anhydride groups, it can introduce unsaturated vinyl groups in the side chains of the styrene-maleic anhydride resin, so as to improve the photosensitivity and degree of crosslinking of the polymer resin. The unsaturated alcohol specified in the present invention also exhibits low volatility. Examples of the unsaturated alcohols suitable for the present invention include pentaerythritol tri-acrylate (PETA), dipentaerythritol pentacrylate (DPPA), etc. PETA has a relatively lower molecular weight, and, after grafting, it results in a shorter side chain thus a better hardness of the resultant polymer film. Thus, PETA will be a better choice for applications such as those involving the use of solder resist which require high hardness. Preferably, the equivalent ratio between the anhydride groups in the styrene-maleic anhydride resin and the unsaturated alcohol should between 1:0.05 and 1:0.9, or more preferably, between 1:0.2 and 1:0.7. If the amount of unsaturated alcohols is too high, the resultant film may not provide adequate hardness. On the other hand, if the amount of unsaturated alcohols is too low, the resultant film may not contain enough double bonds, resulting in inadequate photosensitivity.

The purpose of adding saturated alcohols in the present invention is to facilitate ring-opening reaction, so as to cause enough number of carboxyl groups to be formed into the polymer side chains.

A wide range of saturated alcohols can be used in the present invention. One important requirement it that it should not cause any potential health hazard. Examples of saturated alcohols suitable for the present invention include various alkyl alcohols such as ethanol, n-propanol, isopropanol, n-butanol, 2-butanol, iso-butanol, n-pentanol, 2-methyl-1-pentanol, iso-heptanol, n-hexanol, n-heptanol, cyclopentanol, cyclochexanol, etc; ether alcohols such as methoxylethanol, ethoxyethanol, butoxyethanol, cartitol, propyleneglycol monomethyl ether, dipropyleneglycol, etc. The amount and molecular weight of the saturated alcohols can impact the amount of carboxyl groups to be formed into the polymer binder, as well as the film hardness thereof. Generally speaking, the higher the amount of saturated alcohols used in the reaction, the higher the number of the anhydride rings to be opened, and thus, a higher alkaline developability. The ratio between anhydride groups and saturated alcohols should preferably range between 1:0.2 and 1:10. The molecular weight of the saturated alcohol impacts the chain-to-chain distance in the polymer binder, and a smaller saturated alcohol molecule typically results in a higher hardness of the polymer binder. However, too high a hardness before light exposure may adversely affect the photosensitivity of the photoresist. In general, the amount and molecular weight of the saturated alcohols should be determined based on the valency of the acid groups in the polymer resin and the desired hardness, as well as the presence of other additives.

Similar to the situation for saturated alcohols, a wide range of photoinitiators can be used in the present invention. Preferred photoinitiators should be those which exhibit high degree of optical resolution and can be relatively unaffected by the presence of oxygen, which can retard the crosslinking reaction and reduce the degree of crosslinking at the polymer resin surface. Examples of suitable photoinitiators include benzil dimethyl ketal, 2,4-diethylthioxanthone, isopropylthioxanthone, 2-methyl-1-(4-methythio) pehyl)-2-monpholinopropanone-1), benzophenone. Examples of suitable photosensitizers, which can be used to improve photosensitivity, include 2-dimethylaminoethyl benzoate, ethyl(p-dimethylamino) benzoate, Michler's ketone, etc.

The purpose of unsaturated photomonomers in the photosensitive composition is to provide the required double bonds to proceed with the polymerization reaction upon exposure to UV light.

However, the number of photomonomers should be controlled so as not adversely affect the hardness of the photoresist. In general, the higher the number of double bonds in the photomonomer, the high the degree of crosslinking it will produce. Suitable photomonomers include trimethylolpropane triacrylate, pentaerythritol triacrylate, pentaerythritol tetraacrylate, dipentaerythritol pentaacrylate, dipentaerythritol hexaacrylate, bis-phenol A-type epoxy acrylate, urethane acrylate, etc. The photomonomers can be alone or in combination thereof. Selection of the optimal photomonomers and the amount used are dependent on the desired hardness of the photoresist.

Other additives may be included in the photosensitive composition. This is especially true if the photosensitive composition is to be used in liquid-type solder resist applications. The photosensitive composition may also contain a heat-hardening (thermally curable) resin, such as an epoxy resin. Suitable epoxy resins include bisphenol A-type epoxy resin, phenol formaldehyde-type epoxy resin, phenol-aldehyde-type epoxy resin, brominated bisphenol A-type epoxy resin, etc. A curing agent can also be added to improve the thermally curable characteristics of the epoxy resin. For use in the present invention, the suitable curing agent must not cause the epoxy resin to become hardened at temperatures below 80° C. However, at elevated temperatures, the curing agent should cause the epoxy resin to be rapidly hardened. Suitable curing agents include various imidazoles, dicyandiamid, etc. Other additives can also be added in the photosensitive composition of the present invention. These include fillers, solvent, dispersion agent, anti-sagging agent, defoamer, leveling agent, dyes or pigments, thermal inhibitor, flame retardation agent, etc. After all the ingredients are mixed together, the mixture is milled to ensure a homogeneous dispersion of all the ingredients. Homogeneous dispersion is important to attain the smoothness of the photoresist film and a shining surface.

When a photosensitive composition of the present invention is applied onto a printed circuit board using a liquid type process, typically a screen printing or curtain printing technique is employed. After pre-baking at 75–80° C., the coated composition is UV exposed under a photo mask. The exposure energy typically can range from 100–150 mJ/cm$^2$ for circuit etching, and from 500–600 mJ/cm$^2$ for soldering. After UV exposure, the photosensitive layer is developed using an aqueous sodium carbonate solution. During photoresist etching process, the circuit is completed after the removal of unexposed film. During soldering process, the photosensitive layer after development will be subject to another baking process at about 150° C. for about 40–60 minutes to cause the photosensitive layer to completely hardened. The baked solder resist would exhibit excellent chemical resistance and hardness, so as to be able to sustain the harsh erosive environment induced by soldering and electroplating chemicals.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE A1

Synthesis of Polymer Binder I 820.0 g of diethyleneglycol monoethylether acetate was added into a four-mouth reaction flask. The temperature was raised to 105° C., then 1165.0 g of styrene-maleic anhydride resin, SMA 1000 (Ato Co., ratio of styrene:maleic anhydride=1:1) was gradually added to the reaction flask. After stirring, when the resin powder was totally dissolved, 0.5 g of hydroquinone, 8.5 g N,N-dimethylaminopyridine, and 596 g of pentaerythritol triacrylate were added. The reaction continued for six hours, then 136.0 g of ethanol was added. After eight more hours, the reaction product was diluted with 202.0 g of Naphtha 150 to form Polymer Binder I.

EXAMPLE A2

Synthesis of Polymer Binder II 750.0 g of diethyleneglycol monoethylether acetate was added into a four-mouth reaction flask. The temperature was raised to 105° C., then 1165.0 g of styrene-maleic anhydride resin, SMA 1000 (Ato Co., ratio of styrene:maleic anhydride=1:1) was gradually added to the reaction flask. After stirring, when the resin powder was totally dissolved, 0.5 g of hydroquinone, 8.5 g N,N-dimethylaminopyridine, and 357.0 g of pentaerythritol triacrylate were added. The reaction continued for six hours, then 300.0 g of cyclohexanol was added. After eight more hours, the reaction product was diluted with 230.0 g of Naphtha 150 to form Polymer Binder II.

EXAMPLE A3

Synthesis of Polymer Binder III 1130.0 g of diethyleneglycol monoethylether acetate was added into a four-mouth reaction flask. The temperature was raised to 105° C., then 1200.0 g of styrene-maleic anhydride resin, SMA 2000 (Ato Co., ratio of styrene:maleic anhydride=2:1) was gradually added to the reaction flask. After stirring, when the resin powder was totally dissolved, 0.5 g of hydroquinone, 8.5 g N,N-dimethylaminopyridine, and 410.0 g of pentaerythritol triacrylate were added. The reaction continued for six hours, then 92.0 g of ethanol was added. After eight more hours, Polymer Binder III was obtained.

EXAMPLE A4

Synthesis of Polymer Binder IV 700.0 g of diethyleneglycol monoethylether acetate was added into a four-mouth reaction flask. The temperature was raised to 105° C., then 1200.0 g of styrene-maleic anhydride resin, SMA 2000 (Ato Co., ratio of styrene:maleic anhydride=2:1) was gradually added to the reaction flask. After stirring, when the resin powder was totally dissolved, 0.5 g of hydroquinone, 8.5 g N,N-dimethylaminopyridine, and 570.0 g of dipentaerythritol pentacrylate were added. The reaction continued for six hours, then 180.0 g of n-propanol was added. After eight more hours, the reaction product was diluted with 350.0 g of Naphtha 150 to form Polymer Binder IV.

EXAMPLE A5

Synthesis of Polymer Binder V 650.0 g of diethyleneglycol monoethylether acetate was added into a four-mouth reaction flask. The temperature was raised to 105° C., then 1165.0 g of styrene-maleic anhydride resin, SMA 1000 (Ato Co., ratio of styrene:maleic anhydride=1:1) was gradually added to the reaction flask. After stirring, when the resin powder was totally dissolved, 0.5 g of hydroquinone, 8.5 g N,N-dimethylaminopyridine, and 450.0 g of dipentacrythritol pentaacrylate were added. The reaction continued for six hours, then 340.0 g of butyl cellosolve was added. After eight more hours, the reaction product was diluted with 400.0 g of Naphtha 150 to form Polymer Binder V.

Table A summarizes the reactant compositions for preparing Polymer Binders I through V.

TABLE A

| Reactant | Binder I | Binder II | Binder III | Binder IV | Binder V |
|---|---|---|---|---|---|
| SMA 1000 (styrene: maleic anhydride = 1:1) | 1165.0 | 1165.0 | | | 1165.0 |
| SMA 1000 (styrene: maleic anhydride = 2:1) | | | 1200.0 | 1200.0 | |
| Pentaerythritol triacrylate | 596.0 | 357.0 | 410.0 | | |
| Dipentaerythritol pentaacrylate | | | | 570.0 | 450.0 |
| Ethanol | 136.0 | | 92.0 | | |
| n-propanol | | | | 180.0 | |
| cyclohexanol | | 300.0 | | | |
| Ethyleneglycol monobutylether | | | | | 340.0 |
| Hydroquinone | 0.5 | 0.5 | 0.5 | 0.5 | 0.5 |
| N,N-dimethylamino pyridine | 8.5 | 8.5 | 8.5 | 8.5 | 8.5 |
| Propyleneglycol monomethylether acetate | | | 1130.0 | | |
| Diethyleneglycol monomethylether acetate | 820.0 | 750.0 | | 700.0 | 650.0 |
| Naphtha 150 | 200.0 | 230.0 | | 350.0 | 400.0 |

EXAMPLE 1

Photosensitive composition 1, which contains a main composition and a hardening composition, was prepared wherein the main composition and the hardening composition contained the ingredients listed in Table 1A and 1 B, respectively, which were milled using a triple-roll mill.

TABLE 1A

| Ingredient | Amount (g) |
|---|---|
| Binder (I) | 153.0 |
| 2-Methyl-1-(4-(methylthio)phenyl)-2-morpholinopropanone-1 | 6.0 |
| Dimethylbenzyl ketal | 2.0 |
| 2-Dimethylaminoethyl benzoate | 1.5 |
| Dipentaerythriotal hexaacrylate | 15.0 |
| $BaSO_4$ | 50.0 |
| $SiO_2$ | 20.0 |
| Aerosil-200 | 2.0 |
| Modaflow 2100 | 1.0 |
| Defoamer DC-1000 (from Deuchem Trading Co.) | 1.5 |
| Dicyandiamide | 2.0 |
| Pigment green-36 | 1.2 |
| Pigment green-7 | 1.0 |
| Hydroquinone | 0.2 |
| Carbitol acetate | 10.0 |

TABLE 1B

| Ingredient | Amount (g) |
|---|---|
| YDCN-704 (from Nan Ya Co.) | 5.0 |
| PT-810 (Ciba-Geigy Co.) | 15.0 |
| Brominated Bis-phenol A epoxy | 5.0 |
| Dipentaerythritol hexaacrylate | 5.0 |
| Aerosil-200 | 1.0 |
| $BaSO_4$ | 10.0 |
| Carbitol acetate | 10.0 |
| Naphtha-150 (from Chinese Petroleum) | 5.0 |

The main composition and the hardening composition were mixed, thoroughly stirred, and applied on a printed circuit board (substrate) already having a copper circuit formed thereon using a screen printing technique. The printed circuit board was placed inside an oven at 80° C. for 20 minutes. After being cooled, the photosensitive layer was covered with a photomask and exposed to UV light at an exposure energy of 500 mJ/cm². The exposed photosensitive layer was developed using a 1.0 wt % aqueous $Na_2CO_3$ solution to remove the portion of the circuit to be soldered. The substrate was then placed inside a 150° C. oven for 40 minutes to allow the photosensitive layer to become completely hardened and form the solder resist. The solder resist so prepared was tested for its chemical resistance using $CH_2Cl_2$, 10% $NaOH_{aq}$, and 10% $HCl_{aq}$. Thereafter, the solder resist was tested for its hardness and adhesion characteristics. The test results are summarized in Table B

EXAMPLE 2

Photosensitive composition 2, which contains a main composition and a hardening composition, was prepared wherein the main composition and the hardening composition contained the ingredients listed in Table 2A and 2B, respectively, which were milled using a triple-roll mill.

TABLE 2A

| Ingredient | Amount (g) |
| --- | --- |
| Binder (I) | 153.0 |
| 2-Methyl-1-(4-(methylthio)phenyl)-2-morpholinopropanone-1 | 5.0 |
| 2-Dimethylaminoethyl benzoate | 1.5 |
| Dipentaerythriotal hexaacrylate | 25.0 |
| BaSO₄ | 25.0 |
| Talc | 10.0 |
| Aerosil R-972 | 1.5 |
| Modaflow 2100 | 1.0 |
| Defoamer DC-1000 (from Deuchem Trading Co.) | 1.0 |
| Dicyandiamide | 1.0 |
| 2-Phenyl-4,5-dihydroxy-methylimidazole (2PHZ) | 1.3 |
| Pigment green-36 | 1.2 |
| Pigment green-7 | 1.0 |
| Hydroquinone | 0.2 |
| Carbitol acetate | 5.0 |

TABLE 2B

| Ingredient | Amount (g) |
| --- | --- |
| EPON 1001 (Shell Co.) | 10.0 |
| YX-4000 (Shell Co.) | 20.0 |
| Brominated Bis-phenol A epoxy | 5.0 |
| Dipentaerythritol pentaacrylate | 5.0 |
| Aerosil-200 | 1.0 |
| BaSO₄ | 20.0 |
| Carbitol acetate | 10.0 |
| Naphtha-150 (from Chinese Petroleum) | 5.0 |

The main composition and the hardening composition were mixed, thoroughly stirred, and applied on a printed circuit board (substrate) already having a copper circuit formed thereon using a screen printing technique. The printed circuit board was placed inside an oven at 80° C. for 20 minutes. After being cooled, the photosensitive layer was covered with a photomask and exposed to UV light at an exposure energy of 500 mJ/cm². The exposed photosensitive layer was developed using a 1.0 wt % aqueous $Na_2CO_3$ solution to develop the portion of the circuit to be soldered. The substrate was then placed inside a 150° C. oven for 40 minutes to allow the photosensitive layer to become completely hardened and form the solder resist. The solder resist so prepared was tested for its chemical resistance using $CH_2Cl_2$, 10% $NaOH_{aq}$, and 10% $HCl_{aq}$. Thereafter, the solder resist was tested for its hardness and adhesion characteristics.

EXAMPLE 3

Photosensitive composition 3, which contains a main composition and a hardening composition, was prepared wherein the main composition and the hardening composition contained the ingredients listed in Table 3A and 3B, respectively, which were milled using a triple-roll mill.

TABLE 3A

| Ingredient | Amount (g) |
| --- | --- |
| Binder (I) | 153.0 |
| 2-Methyl-1-(4-(methylthio)phenyl)-2-morpholinopropanone-1 | 6.0 |
| 2-Dimethylaminoethyl benzoate | 1.0 |
| Dipentaerythriotal pentaacrylate | 20.0 |
| BaSO₄ | 30.0 |
| SiO₂ | 5.0 |
| Aerosil-200 | 1.0 |
| Modaflow 2100 | 1.0 |
| Defoamer DC-1000 (from Deuchem Trading Co.) | 1.0 |
| Dicyandiamide | 0.5 |
| 2-Phenyl-4,5-dihydroxy-methylimidazole (2PHZ) | 2.0 |
| Pigment green-36 | 0.1 |
| Pigment yellow-139 | 0.6 |
| Hydroquinone | 0.2 |
| Carbitol acetate | 10.0 |

TABLE 3B

| Ingredient | Amount (g) |
| --- | --- |
| YDCN-704 (Nan Ya Co.) | 5.0 |
| EPON 1001 (Shell Co.) | 10.0 |
| Brominated Bis-phenol A epoxy | 5.0 |
| Pentaerythritol triacrylate | 5.0 |
| Aerosil-200 | 0.5 |
| BaSO₄ | 10.0 |
| Carbitol acetate | 10.0 |
| Naphtha-150 (from Chinese Petroleum) | 10.0 |

The main composition and the hardening composition were mixed, thoroughly stirred, and applied on a printed circuit board (substrate) already having a copper circuit formed thereon using a screen printing technique. The printed circuit board was placed inside an oven at 80° C. for 20 minutes. After being cooled, the photosensitive layer was covered with a photomask and exposed to UV light at an exposure energy of 550 mJ/cm². The exposed photosensitive layer was developed using a 1.0 wt % aqueous $Na_2CO_3$ solution to develop the portion of the circuit to be soldered. The substrate was then placed inside a 150° C. oven for 40 minutes to allow the photosensitive layer to become completely hardened and form the solder resist. The solder resist so prepared was tested for its chemical resistance using $CH_2Cl_2$, 10% $NaOH_{aq}$, and 10% $HCl_{aq}$. Thereafter, the solder resist was tested for its hardness and adhesion characteristics.

EXAMPLE 4

Photosensitive composition 4, which contains a main composition and a hardening composition, was prepared wherein the main composition and the hardening composition contained the ingredients listed in Table 4A and 4B, respectively, which were milled using a triple-roll mill.

TABLE 4A

| Ingredient | Amount (g) |
| --- | --- |
| Binder (II) | 153.0 |
| 2-Methyl-1-(4-(methylthio)phenyl)-2-morpholinopropanone-1 | 10.0 |

TABLE 4A-continued

| Ingredient | Amount (g) |
| --- | --- |
| 2-Dimethylaminoethyl benzoate | 2.0 |
| Pentaerythriotal triacrylate | 10.0 |
| Dipentaerythriotal hexaacrylate | 10.0 |
| BaSO$_4$ | 40.0 |
| Talc | 5.0 |
| Aerosil-200 | 3.0 |
| Al$_2$O$_3$ | 2.0 |
| Modaflow 2100 | 1.0 |
| Defoamer DC-1000 (from Deuchem Trading Co.) | 1.0 |
| Dicyandiamide | 2.0 |
| Pigment green-7 | 0.1 |
| Hydroquinone | 0.2 |
| Carbitol acetate | 10.0 |

TABLE 4B

| Ingredient | Amount (g) |
| --- | --- |
| EPON 1001 (Shell Co.) | 10.0 |
| EPON 1031 (Shell Co.) | 5.0 |
| PT-810 (Ciba-Geigy Co.) | 15.0 |
| Dipentaerythritol hexaacrylate | 5.0 |
| Aerosil-200 | 1.0 |
| BaSO$_4$ | 10.0 |
| Butyl Cellosolve | 10.0 |
| Naphtha-150 (from Chinese Petroleum) | 5.0 |

The main composition and the hardening composition were mixed, thoroughly stirred, and applied on a printed circuit board (substrate) already having a copper circuit formed thereon using a screen printing technique. The printed circuit board was placed inside an oven at 80° C. for 20 minutes. After being cooled, the photosensitive layer was covered with a photomask and exposed to UV light at an exposure energy of 600 mJ/cm$^2$. The exposed photosensitive layer was developed using a 1.0 wt % aqueous Na$_2$CO$_3$ solution to develop the portion of the circuit to be soldered. The substrate was then placed inside a 150° C. oven for 40 minutes to allow the photosensitive layer to become completely hardened and form the solder resist. The solder resist so prepared was tested for its chemical resistance using CH$_2$Cl$_2$, 10% NaOH$_{aq}$, and 10% HCl$_{aq}$. Thereafter, the solder resist was tested for its hardness and adhesion characteristics.

EXAMPLE 5

Photosensitive composition 5, which contains a main composition and a hardening composition, was prepared wherein the main composition and the hardening composition contained the ingredients listed in Table 5A and 5B, respectively, which were milled using a triple-roll mill.

TABLE 5A

| Ingredient | Amount (g) |
| --- | --- |
| Binder (II) | 153.0 |
| 2-Methyl-1-(4-(methylthio)phenyl)-2-morpholinopropanone-1 | 5.0 |
| Dimethylbenzyl ketal | 2.0 |
| 2-Dimethylaminoethyl benzoate | 1.0 |
| Dipentaerythriotal pentaacrylate | 10.0 |
| BaSO$_4$ | 45.0 |
| SiO$_2$ | 5.0 |
| Aerosil R-972 | 1.5 |
| Modaflow 2100 | 1.0 |
| Defoamer DC-1000 (from Deuchem Trading Co.) | 1.0 |

TABLE 5A-continued

| Ingredient | Amount (g) |
| --- | --- |
| Dicyandiamide | 2.0 |
| Pigment green-7 | 1.0 |
| Hydroquinone | 0.2 |
| Carbitol acetate | 10.0 |

TABLE 5B

| Ingredient | Amount (g) |
| --- | --- |
| YDCN-704 (Nan Ya Co.) | 10.0 |
| YX-4000 (Shell Co.) | 20.0 |
| Brominated Bis-phenol A epoxy | 5.0 |
| Dipentaerythritol hexaacrylate | 10.0 |
| Aerosil-200 | 1.0 |
| BaSO$_4$ | 15.0 |
| Carbitol acetate | 10.0 |
| Naphtha-150 (from Chinese Petroleum) | 5.0 |

The main composition and the hardening composition were mixed, thoroughly stirred, and applied on a printed circuit board (substrate) already having a copper circuit formed thereon using a screen printing technique. The printed circuit board was placed inside an oven at 80° C. for 20 minutes. After being cooled, the photosensitive layer was covered with a photomask and exposed to UV light at an exposure energy of 550 mJ/cm$^2$. The exposed photosensitive layer was developed using a 1.0 wt % aqueous Na$_2$CO$_3$ solution to develop the portion of the circuit to be soldered. The substrate was then placed inside a 150° C. oven for 40 minutes to allow the photosensitive layer to become completely hardened and form the solder resist. The solder resist so prepared was tested for its chemical resistance using CH$_2$Cl$_2$, 10% NaOH$_{aq}$ and 10% HCl$_{aq}$. Thereafter, the solder resist was tested for its hardness and adhesion characteristics.

EXAMPLE 6

Photosensitive composition 6, which contains a main composition and a hardening composition, was prepared wherein the main composition and the hardening composition contained the ingredients listed in Table 6A and 6B, respectively, which were milled using a triple-roll mill.

TABLE 6A

| Ingredient | Amount (g) |
| --- | --- |
| Binder (IV) | 153.0 |
| 2-Methyl-1-(4-(methylthio)phenyl)-2-morpholinopropanone-1 | 8.0 |
| 2-Dimethylaminoethyl benzoate | 2.0 |
| Pentaerythritol triacrylate | 5.0 |
| Dipentaerythriotal pentaacrylate | 15.0 |
| BaSO$_4$ | 70.0 |
| Aerosil R-972 | 1.0 |
| Al$_2$O$_3$ | 2.0 |
| Modaflow 2100 | 1.0 |
| Defoamer DC-1000 (from Deuchem Trading Co.) | 1.5 |
| Dicyandiamide | 1.0 |
| 2-Methyl-4,5-dihydroxy-methylimidazole | 1.0 |
| Pigment green-36 | 1.2 |
| Pigment green-7 | 1.0 |
| Hydroquinone | 0.2 |
| Carbitol acetate | 15.0 |

TABLE 6B

| Ingredient | Amount (g) |
| --- | --- |
| EPON 1001 (Shell Co.) | 5.0 |
| EPON 1031 (Shell Co.) | 5.0 |
| PT-810 (Ciba-Geigy Co.) | 10.0 |
| XY-4000 (Shell Co.) | 10.0 |
| Dipentaerythritol pentaacrylate | 5.0 |
| Aerosil-200 | 1.0 |
| $BaSO_4$ | 15.0 |
| Carbitol acetate | 10.0 |
| Naphtha-150 (from Chinese Petroleum) | 5.0 |

The main composition and the hardening composition were mixed, thoroughly stirred, and applied on a printed circuit board (substrate) already having a copper circuit formed thereon using a screen printing technique. The printed circuit board was placed inside an oven at 80° C. for 20 minutes. After being cooled, the photosensitive layer was covered with a photomask and exposed to UV light at an exposure energy of 550 mJ/cm$^2$. The exposed photosensitive layer was developed using a 1.0 wt % aqueous $Na_2CO_3$ solution to develop the portion of the circuit to be soldered. The substrate was then placed inside a 150° C. oven for 40 minutes to allow the photosensitive layer to become completely hardened and form the solder resist. The solder resist so prepared was tested for its chemical resistance using $CH_2Cl_2$, 10% $NaOH_{aq}$, and 10% $HCl_{aq}$. Thereafter, the solder resist was tested for its hardness and adhesion characteristics.

EXAMPLE 7

Photosensitive composition 7, which contains a main composition and a hardening composition, was prepared wherein the main composition and the hardening composition contained the ingredients listed in Table 7A and 7B, respectively, which were milled using a triple-roll mill.

TABLE 7A

| Ingredient | Amount (g) |
| --- | --- |
| Binder (V) | 153.0 |
| 2-Methyl-1-(4-(methylthio)phenyl)-2-morpholinopropanone-1 | 8.0 |
| 2-Dimethylaminoethyl benzoate | 2.0 |
| Dipentaerythrioatal pentaacrylate | 15.0 |
| Epoxy acrylate (prepared from DEN-438, from Shell Co. and acrylic acid) | 20.0 |
| $BaSO_4$ | 30.0 |
| $SiO_2$ | 15.0 |
| Aerosil R-972 | 2.0 |
| Modaflow 2100 | 1.0 |
| Defoamer DC-1000 (from Deuchem Trading Co.) | 1.0 |
| Dicyandiamide | 2.0 |
| Pigment green-36 | 1.2 |
| Pigment green-7 | 1.0 |
| Hydroquinone | 0.2 |
| Carbitol acetate | 10.0 |

TABLE 7B

| Ingredient | Amount (g) |
| --- | --- |
| EPON 1001 (Shell Co.) | 10.0 |
| PT-810 (Ciba-Geigy Co.) | 10.0 |
| Brominated Bis-phenol A epoxy | 15.0 |
| Aerosil-200 | 1.5 |
| $BaSO_4$ | 10.0 |

TABLE 7B-continued

| Ingredient | Amount (g) |
| --- | --- |
| Butyl cellosolve | 10.0 |
| Naphtha-150 (from Chinese Petroleum) | 5.0 |

The main composition and the hardening composition were mixed, thoroughly stirred, and applied on a printed circuit board (substrate) already having a copper circuit formed thereon using a screen printing technique. The printed circuit board was placed inside an oven at 80° C. for 20 minutes. After being cooled, the photosensitive layer was covered with a photomask and exposed to UV light at an exposure energy of 450 mJ/cm$^2$. The exposed photosensitive layer was developed using a 1.0 wt % aqueous $Na_2CO_3$ solution to develop the portion of the circuit to be soldered. The substrate was then placed inside a 150° C. oven for 40 minutes to allow the photosensitive layer to become completely hardened and form the solder resist. The solder resist so prepared was tested for its chemical resistance using $CH_2Cl_2$, 10% $NaOH_{aq}$, and 10% $HCl_{aq}$. Thereafter, the solder resist was tested for its hardness and adhesion characteristics.

EXAMPLE 8

Photosensitive composition 8, which contained the ingredients listed in Table 8A, was milled using a triple-roll mill.

TABLE 8A

| Ingredient | Amount (g) |
| --- | --- |
| Binder (III) | 167.0 |
| 2-Methyl-1-(4-(methylthio)phenyl)-2-morpholinopropanone-1 | 3.0 |
| Dimethylbenzyl ketal | 1.0 |
| 2-Dimethylaminoethyl benzoate | 0.5 |
| Pentaerythriotal triacrylate | 10.0 |
| Dipentaerythriotal pentaacrylate | 15.0 |
| Talc | 20.0 |
| Aerosil-200 | 0.5 |
| Defoamer DC-1000 (from Deuchem Trading Co.) | 0.5 |
| Leuco crystal violet | 1.3 |
| Hydroquinone | 0.2 |
| Propyleneglycol monomethylether acetate | 40.0 |

The photosensitive composition prepared above was applied on a substrate and placed inside an oven at 80° C. for 10 minutes. After being cooled, the photosensitive layer was covered with a photomask and exposed to UV light at an exposure energy of 100 mJ/cm$^2$. The exposed photosensitive layer was developed using a 1.0 wt % aqueous $Na_2CO_3$ solution followed by $CuCl_2$ etching. The residual photosensitive layer was then removed by a 3% $NaOH_{aq}$ at 50° C. and a patterned conductive circuit was obtained.

Table B summarizes the test results obtained from Examples 1 through 8.

TABLE B

| Example | 1 | 2 | 3 | 4 | 5 | 6 | 7 | 8 |
|---|---|---|---|---|---|---|---|---|
| Resolution | 50 μm | 50 μm | 50 μm | 50 μm | 50 μm | 50 μm | 50 μm | 25 μm |
| Solvent resistance ($CH_2Cl_2$) | ≧20 min | ≧20 min | ≧20 min | >20 min | >10 min | >20 min | >20 min | — |
| Chemical rResistance (10% NaOH) | ≧10 min | ≧10 min | ≧10 min | ≧10 min | ≧10 min | ≧10 min | ≧10 min | — |
| Chemical resistance (10% HCl) | ≧10 min | >10 min | >10 min | ≧5 min | ≧10 min | ≧10 min | ≧10 min | — |
| Pencil hardness | 6 H | 6 H | 6 H | 5 H | 6 H | 6 H | 6 H | — |
| Adhesion (After 260° C. hot air leveling) | 100% | 100% | 100% | 100% | 100% | 100% | 100% | — |

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A photosensitive composition comprising:
   (a) a polymer binder;
   (b) a photoinitiator; and
   (c) an unsaturated photomonomer;
   (d) wherein said polymer binder is prepared from a reaction among the following reactants;
      (i) a styrene-maleic anhydride resin containing repeating units of styrene and anhydride groups,
      (ii) an unsaturated compound containing at least one hydroxy group and at least three acrylic groups, and
      (iii) a saturated alcohol.

2. The photosensitive composition according to claim 1 wherein said styrene-maleic anhydride resin is prepared from a polymerization reaction of styrene and maleic anhydride in a molar ratio ranging from 3:1 to 1:3.

3. The photosensitive composition according to claim 1 wherein said styrene-maleic anhydride resin is prepared from a polymerization reaction of styrene and maleic anhydride in a molar ratio ranging from 1:1 to 3:1.

4. The photosensitive composition according to claim 1 wherein said styrene-maleic anhydride resin has a molecular weight ranging from 800 to 100,000.

5. The photosensitive composition according to claim 1 wherein said unsaturated compound contains one hydroxy group and three acrylic groups.

6. The photosensitive composition according to claim 1 wherein said unsaturated compound is pentaerythritol triacrylate.

7. The photosensitive composition according to claim 1 wherein said unsaturated compound contains one hydroxy group and five acrylic groups.

8. The photosensitive composition according to claim 1 wherein said unsaturated compound is dipentaerythritol pentaacrylate.

9. The photosensitive composition according to claim 1 wherein said saturated alcohol is an alkyl alcohol.

10. The photosensitive composition according to claim 1 wherein said saturated alcohol is an alcohol which contains an ether group.

11. The photosensitive composition according to claim 1 wherein said saturated alcohol is an alkyl alcohol selected from the group consisting of ethanol, n-propanol, isopropanol, n-butanol, 2-butanol, iso-butanol, n-pentanol, 2-methyl-1-pentanol, iso-heptanol, n-hexanol, n-heptanol, cyclopentanol, and cyclochexanol.

12. The photosensitive composition according to claim 1 wherein said saturated alcohol is an ether alcohol selected from the group consisting of ether alcohols such as methoxyethanol, ethoxyethanol, butoxyethanol, cartitol, propyleneglycol monomethyl ether, and dipropyleneglycol monomethylether.

13. The photosensitive composition according to claim 1 where said unsaturated compound is provided at an equivalent ratio ranging between 1:0.05 to 1:0.9, relative to said anhydride groups.

14. The photosensitive composition according to claim 1 where said unsaturated compound is provided at an equivalent ratio ranging between 1:0.2 to 1:0.7, relative to said anhydride groups.

15. The photosensitive composition according to claim 1 which further comprises an epoxy resin and a curing agent.

16. The photosensitive composition according to claim 15 wherein said curing agent is dicyandiamide or an imidazole compound.

17. The photosensitive composition according to claim 1 which further comprises an epoxy acrylate.

18. The photosensitive composition according to claim 17 wherein said epoxy acrylate is a reaction product of novolac epoxy and acrylic acid.

19. The photosensitive composition according to claim 18 wherein said novolac epoxy is a cresol novolac epoxy.

20. A photosensitive composition comprising:
   (a) a polymer binder;
   (b) a photoinitiator; and
   (c) an unsaturated photomonomer;
   (d) wherein said polymer binder is prepared from a reaction among the following reactants:
      (i) a styrene-maleic anhydride resin containing repeating units of styrene and anhydride groups,
      (ii) an unsaturated compound containing at least one hydroxy group and at least three acrylic groups, and
      (iii) water.

* * * * *